United States Patent
Nakamura (10) Patent No.: US 10,882,116 B2
(45) Date of Patent: Jan. 5, 2021

(54) COATED CUTTING TOOL

(71) Applicant: TUNGALOY CORPORATION, Fukushima (JP)

(72) Inventor: Takaaki Nakamura, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 112 days.

(21) Appl. No.: 16/313,957

(22) PCT Filed: Jun. 27, 2017

(86) PCT No.: PCT/JP2017/023549
§ 371 (c)(1),
(2) Date: Dec. 28, 2018

(87) PCT Pub. No.: WO2018/003789
PCT Pub. Date: Jan. 4, 2018

(65) Prior Publication Data
US 2019/0314899 A1    Oct. 17, 2019

(30) Foreign Application Priority Data
Jul. 1, 2016   (JP) .................. 2016-131717

(51) Int. Cl.
*B23B 27/14* (2006.01)
*B23C 5/20* (2006.01)
(Continued)

(52) U.S. Cl.
CPC .............. *B23B 27/148* (2013.01); *B23C 5/20* (2013.01); *C23C 16/36* (2013.01); *C23C 16/403* (2013.01);
(Continued)

(58) Field of Classification Search
CPC ...... B23B 27/148; C23C 16/36; C23C 16/403
(Continued)

(56) References Cited

U.S. PATENT DOCUMENTS 7,597,970 B2 * 10/2009 Fukano ................. C23C 30/005
428/701
7,923,101 B2 *  4/2011 Ruppi .................. C23C 16/029
428/698
(Continued)

FOREIGN PATENT DOCUMENTS

| JP | H11-124672 A | 5/1999 |
| JP | 5872748 B1 | 3/2016 |
| KR | 20150093142 * | 8/2015 |

OTHER PUBLICATIONS

International Preliminary Report on Patentability and Written Opinion issued in PCT/JP2017/023549; dated Jan. 1, 2019.
(Continued)

*Primary Examiner* — Archene A Turner
(74) *Attorney, Agent, or Firm* — Studebaker & Brackett PC (57) ABSTRACT

A coated cutting tool comprising a substrate and a coating layer formed on the substrate, wherein: the coating layer is laminated in order from the substrate side toward a surface side of the coating layer; and the coating layer comprises an upper layer and a lower layer which satisfy the following conditions that: "at least one of {422} planes of TiCN particles located closest to the surface in the lower layer and at least one of {006} planes of α-type $Al_2O_3$ particles located closest to the substrate in the upper layer and immediately above the TiCN particles are substantially parallel to each other, and at least one of {111} planes of the TiCN particles and at least one of {110} planes of the α-type $Al_2O_3$ particles are substantially parallel to each other"; and "at least one of {111} planes of TiCN particles located closest to the surface in the lower layer and at least one of {006} planes of α-type $Al_2O_3$ particles located closest to the substrate in the upper layer and immediately above the TiCN particles are substantially parallel to each other, and at least
(Continued)

one of {422} planes of the TiCN particles and at least one of {110} planes of the α-type $Al_2O_3$ particles are substantially parallel to each other."

20 Claims, 1 Drawing Sheet

(51) Int. Cl.
 *C23C 16/36* (2006.01)
 *C23C 16/40* (2006.01)
(52) U.S. Cl.
 CPC ....... *B23B 2224/32* (2013.01); *B23B 2228/10* (2013.01)
(58) Field of Classification Search
 USPC ........... 51/307, 309; 407/119; 428/216, 336, 428/698, 701, 702
 See application file for complete search history.

(56) References Cited

U.S. PATENT DOCUMENTS

| | | | |
|---|---|---|---|
| 2014/0308083 A1* | 10/2014 | Bjormander | C23C 16/36 407/119 |
| 2014/0377024 A1* | 12/2014 | Sobana | C23C 16/30 407/119 |
| 2015/0003925 A1 | 1/2015 | Ostlund et al. | |
| 2017/0191169 A1 | 7/2017 | Imamura et al. | |
| 2018/0258525 A1* | 9/2018 | Cho | C23C 16/36 |

OTHER PUBLICATIONS

International Search Report issued in PCT/JP2017/023549; dated Jul. 25, 2017.

* cited by examiner

COATED CUTTING TOOL

TECHNICAL FIELD

The present invention relates to a coated cutting tool.

BACKGROUND ART

Conventionally, a coated cutting tool formed by depositing, through chemical vapor deposition, a coating layer with a total thickness of from 3 μm or more to 20 μm or less onto a surface of a substrate comprised of a cemented carbide, is well known for being used for the cutting of steel, cast iron, etc. An example of the above coating layer is a coating layer comprised of a single layer of one kind selected from the group consisting of a Ti carbide, a Ti nitride, a Ti carbonitride, a Ti oxycarbide, a Ti oxycarbonitride and aluminum oxide, or comprised of multiple layers of two or more kinds selected therefrom.

Patent Document 1 discloses a cutting tool comprising: a substrate comprised of a cemented carbide; and a coating layer including an inner layer consisting of TiCN and an outer layer consisting of α-type $Al_2O_3$, such coating layer being formed on a surface of the substrate, wherein a texture coefficient TC (311) of a (311) plane of TiCN has a value of from 1.5 or more to 3 or less, and wherein a texture coefficient TCa (104) of a (104) plane of an α-type aluminum oxide layer and a texture coefficient TCa (116) of a (116) plane thereof each have a value of 1.3 or more.

CITATION LIST

Patent Documents

Patent Document 1: JPH11-124672 A

SUMMARY

Technical Problem

An increase in speed, feed and depth of cut has become more conspicuous in cutting in recent times, which requires the fracture resistance and wear resistance of a tool to be further improved than those involved in the prior art. In particular, in recent years, there has been a growth in cutting which places a large impact on a cutting edge, such as heavy interrupted cutting of steel, and under such severe cutting conditions, a coating layer of a conventional tool is unable to withstand a large impact, and this results in chipping and the peeling of a hard coating layer being likely to occur. This triggers a problem in that abrupt tool damage, such as the occurrence of cutting-edge fractures or abnormal wear, prevents the tool life from being extended.

Against such background, only if, as in the tool disclosed in Patent Document 1 above, control is performed on the crystal orientation of a (311) plane of TiCN and the respective crystal orientations of a (104) plane of an α-type aluminum oxide layer and a (116) plane thereof, sufficient chipping resistance and fracture resistance are not achieved under the cutting conditions involving the application of a large impact.

The present invention has been made in order to solve these problems, and an object of the present invention is to provide a coated cutting tool which has excellent chipping resistance, fracture resistance and wear resistance and which accordingly has a long tool life.

Solution to Problem

The present inventor has conducted studies regarding extending the tool life of a coated cutting tool and has then found that the following configurations, with a focus on the respective crystal orientations of TiCN and an α-type aluminum oxide layer, allow the chipping resistance, fracture resistance and wear resistance of the coated cutting tool to be improved, and has further found that, as a result, the tool life of the coated cutting tool can be extended, and this has led to the completion of the present invention.

Namely, the gist of the present invention is as set forth below:

(1) A coated cutting tool comprising a substrate and a coating layer formed on the substrate, wherein:

the coating layer comprises a lower layer containing TiCN and an upper layer containing α-type $Al_2O_3$, the lower layer and the upper layer being laminated in order from the substrate side toward a surface side of the coating layer; and the lower layer and the upper layer comprise a TiCN particle and an α-type $Al_2O_3$ particle which satisfy condition (I) below and a TiCN particle and an α-type $Al_2O_3$ particle which satisfy condition (II) below.

Condition (I): At least one of {422} planes of TiCN particles located closest to the surface in the lower layer and at least one of {006} planes of α-type $Al_2O_3$ particles located closest to the substrate in the upper layer and immediately above the TiCN particles are substantially parallel to each other, and at least one of {111} planes of the TiCN particles and at least one of {110} planes of the α-type $Al_2O_3$ particles are substantially parallel to each other.

Condition (II): At least one of {111} planes of TiCN particles located closest to the surface in the lower layer and at least one of {006} planes of α-type $Al_2O_3$ particles located closest to the substrate in the upper layer and immediately above the TiCN particles are substantially parallel to each other, and at least one of {422} planes of the TiCN particles and at least one of {110} planes of the α-type $Al_2O_3$ particles are substantially parallel to each other.

(2) The coated cutting tool according to (1), wherein, based on a total number of TiCN particles located closest to the surface in the lower layer and α-type $Al_2O_3$ particles located closest to the substrate in the upper layer, a ratio of a total number of TiCN particles and α-type $Al_2O_3$ particles which satisfy condition (I) and TiCN particles and α-type $Al_2O_3$ particles which satisfy condition (II) is from 50% or more to 100% or less.

(3) The coated cutting tool according to (1) or (2), wherein an average thickness of the upper layer is from 1 μm or more to 15 μm or less.

(4) The coated cutting tool according to any of (1) to (3), wherein an average thickness of the lower layer is from 2 μm or more to 20 μm or less.

(5) The coated cutting tool according to any of (1) to (4), wherein the coating layer comprises, between the lower layer and the upper layer, an intermediate layer containing a compound of at least one kind selected from the group consisting of a Ti carbide, a Ti nitride, a Ti oxide, a Ti oxycarbide, a Ti oxynitride, and a Ti oxycarbonitride, and an average thickness of the intermediate layer is from 0.1 μm or more to 0.5 μm or less.

(6) The coated cutting tool according to any of (1) to (5), wherein an average thickness of the coating layer is from 3 μm or more to 30 μm or less.

(7) The coated cutting tool according to any of (1) to (6), wherein the substrate is a cemented carbide, cermet, ceramic or a cubic boron nitride sintered body.

Advantageous Effects of Invention

The present invention can provide a coated cutting tool which has excellent chipping resistance, fracture resistance and wear resistance and which accordingly has a long tool life.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

<Coated Cutting Tool>

A coated cutting tool according to the present embodiment comprises a substrate and a coating layer formed on the substrate. Specific examples of types of the coated cutting tool include an indexable cutting insert for milling or turning, a drill and an end mill.

<Substrate>

The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is preferably a cemented carbide, cermet, ceramic or a cubic boron nitride sintered body because this provides further excellent wear resistance and fracture resistance.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

<Coating Layer>

The average thickness of the coating layer in the present embodiment is preferably from 3 μm or more to 30 μm or less. If the average thickness of the coating layer is 3 μm or more, this indicates the tendency of the wear resistance to be further improved, and if the average thickness thereof is 30 μm or less, this indicates the tendency of the adhesion of the coating layer with the substrate and the fracture resistance to be further increased. From the same perspective, the average thickness of the coating layer is further preferably from 3 μm or more to 20 μm or less. It should be noted that the average thickness of each layer in the coated tool of the present embodiment can be obtained by: measuring the thickness of each layer and the thickness of the entire coating layer from each of the cross-sectional surfaces at three or more locations; and calculating the average value of the resulting measurements.

The coating layer in the present embodiment comprises a lower layer containing TiCN (titanium carbonitride) and an upper layer containing α-type $Al_2O_3$, which are laminated in order from the substrate side to the coating layer's surface side. The lower layer and the upper layer in the present embodiment comprise TiCN particles and α-type $Al_2O_3$ particles which satisfy condition (I) below and TiCN particles and α-type $Al_2O_3$ particles which satisfy condition (II) below. Under condition (I), at least one of {422} planes of TiCN particles located closest to the surface (hereinafter, the surface of the coating layer is also referred to as "the surface") in the lower layer and at least one of {006} planes of α-type $Al_2O_3$ particles closest to the substrate in the upper layer and immediately above the TiCN particles have a substantially parallel relationship, and at least one of {111} planes of the TiCN particles and at least one of {110} planes of the α-type $Al_2O_3$ particles have a substantially parallel relationship. When such condition (I) is satisfied, this mainly leads to improved adhesion between the lower layer and the upper layer without a reduction in the wear resistance of the coated cutting tool. This results in improved chipping resistance and fracture resistance in the coated cutting tool. In this specification, the term "α-type $Al_2O_3$ particles located immediately above TiCN particles" refers to, when the lower layer and the upper layer are in direct contact with each other, α-type $Al_2O_3$ particles which are in direct contact with TiCN particles, and such term refers to, when an intermediate layer (an adhesion layer) described below is present between the lower layer and the upper layer, α-type $Al_2O_3$ particles which are located in a lamination direction of such layers with respect to the TiCN particles and which are in direct contact with the intermediate layer (the adhesion layer).

Further, under condition (II), at least one of {111} planes of TiCN particles located closest to the surface in the lower layer and at least one of {006} planes of α-type $Al_2O_3$ particles located closest to the substrate in the upper layer and immediately above the TiCN particles have a substantially parallel relationship, and at least one of {422} planes of the TiCN particles and at least one of {110} planes of the α-type $Al_2O_3$ particles have a substantially parallel relationship. When such condition (II) is satisfied, this can mainly achieve stronger adhesion between the lower layer and the upper layer. Accordingly, if the coating layer comprises particles satisfying condition (II), around such particles, the falling of particles in the upper layer can be suppressed, thereby leading to improved chipping resistance and fracture resistance. Therefore, if the coating layer comprises both particles satisfying condition (I) above and particles satisfying condition (II) above, this leads to improved chipping resistance and fracture resistance without a reduction in the wear resistance.

A ratio RC of the number of combinations of a TiCN particle and an α-type $Al_2O_3$ particle which are represented by equation (1) below is preferably from 50% or more to 100% or less because this leads to further excellent wear resistance, chipping resistance and fracture resistance. From the perspective of particularly enhancing the adhesion between the lower layer and the upper layer and thereby improving chipping resistance and fracture resistance, a ratio RC1 of the number of combinations of a TiCN particle and an α-type $Al_2O_3$ particle which are represented by equation (2) below is preferably 1% or more. Further, from the perspective of particularly suppressing the falling of particles in the upper layer and thereby improving chipping resistance and fracture resistance, a ratio RC2 of the number of combinations of a TiCN particle and an α-type $Al_2O_3$ particle which are represented by equation (3) below is preferably 1% or more. Herein, with regard to the number of combinations of a TiCN particle and an α-type $Al_2O_3$ particle (hereinafter referred to as the "number of combinations"), for example, when two α-type $Al_2O_3$ particles serving as subjects of determination as to whether or not condition (I) and condition (II) are satisfied exist with respect to a TiCN particle, the number of combinations is two. Further, for example, when two TiCN particles serving as subjects for determining whether or not condition (I) and condition (II) are satisfied exist with respect to an α-type $Al_2O_3$ particle, the number of combinations is two.

$$RC=(R1+R2)/RS\times100 \quad (1)$$

$$RC1=R1/RS\times100 \quad (2)$$

$$RC2=R2/RS\times100 \quad (3)$$

In the equations, RS denotes a total number of combinations of a TiCN particle and an α-type $Al_2O_3$ particle with regard to the TiCN particles located closest to the surface in the lower layer and also with regard to, from among the α-type $Al_2O_3$ particles located closest to the substrate in the upper layer, the α-type $Al_2O_3$ particles serving as subjects for determining whether or not condition (I) and condition (II) are satisfied with respect to the above TiCN particles; R1 denotes, from among the above total number of combinations, a total number of combinations of a TiCN particle and an α-type $Al_2O_3$ particle which satisfy condition (I); and R2 denotes, from among the above total number of combinations, a total number of combinations of a TiCN particle and an α-type $Al_2O_3$ particle which satisfy condition (II). RS refers to a sum of R1, R2 and a total number of combinations of a TiCN particle and an α-type $Al_2O_3$ particle which satisfy neither condition (I) nor condition (II).

In this specification, a region surrounded by a structure boundary with a misorientation of 5 degrees or more when evaluations are made with an electron backscatter diffraction pattern apparatus (EBSD) is employed as a "particle." Further, a TiCN particle located closest to the surface in the lower layer of the present embodiment is defined as a region, serving as an effective crystal grain, surrounded by a structure boundary with a misorientation of 5 degrees or more when evaluations are made from the surface side with the EBSD. Moreover, the α-type $Al_2O_3$ particle located closest to the substrate in the upper layer of the present embodiment is defined as a region, serving as an effective crystal grain, surrounded by a structure boundary with a misorientation of 5 degrees or more when evaluations are made from the substrate side with the EBSD.

In the coating layer of the present embodiment, the relationship between the crystal planes of the particles located closest to the surface in the lower layer and the crystal planes of the particles located closest to the substrate in the upper layer and immediately above the above particles can be obtained from the pole figures and EBSD maps obtained using an EBSD attached to a commercially available scanning electron microscope (SEM) or transmission electron microscope (TEM).

More specifically, the above relationship can be obtained as set forth below. Firstly, mirror polishing is performed on the coated cutting tool in a direction orthogonal or substantially orthogonal to a surface of the substrate so as to have a cross-sectional structure surface exposed. Examples of a method of having a cross-sectional structure surface of the coated cutting tool exposed include: a polishing method with the use of diamond paste or colloidal silica; and ion milling. The sample having the exposed cross-sectional structure surface of the coated cutting tool is set on an FE-SEM, and the cross-sectional structure surface of the sample is then irradiated with an electron beam at an angle of incidence of 70° under the conditions of an acceleration voltage of 15 kV and an irradiation current of 0.5 nA. As to a measurement range of 50 μm in a direction parallel to the surface of the substrate, it is desirable to perform measurements under the EBSD setting of a step size of 0.1 μm. A region surrounded by a structure boundary with a misorientation of 5 degrees or more is defined as referring to a particle. At this time, the measurements are performed with a field of view covering the lower layer and the upper layer. The obtained information on crystal orientations is used to create the pole figures of {111} planes, {422} planes, {222} planes and {10-1} planes, and such information is analyzed, if necessary, by using the EBSD. It should be noted that {222} planes of α-type $Al_2O_3$ in the upper layer can be denoted as {006} planes in terms of the way of setting the axis representing crystal planes. Similarly, {10-1} planes can be denoted as {110} planes. Further, the term "at least one of {422} planes" refers to at least one crystal plane from among the crystal planes equivalent to {422} planes, and more specifically, such term refers to at least one selected from the group consisting of a (422) plane, a (-422) plane, a (4-22) plane and a (42-2) plane. Similarly, the term "at least one of {006} planes" refers to at least one crystal plane from among the crystal planes equivalent to {006} planes, the term "at least one of {111} planes" refers to at least one crystal plane from among the crystal planes equivalent to {111} planes, and the term "at least one of {110} planes" refers to at least one crystal plane from among the crystal planes equivalent to {110} planes.

In this specification, two crystal planes being "substantially parallel" to each other indicates that the respective normals of two crystal planes are substantially parallel to each other, and in the pole figures of two crystal planes, when the plots indicative of the normals are located at the same positions, such two crystal planes can be said to be "substantially parallel" to each other. It should be noted that the scope of "substantially parallel" means that the angle formed by the normals of the two crystal planes falls within ±5 degrees.

R1, R2 and RS in equations (1) to (3) above can be derived from each of the above combinations at each measurement point when a step size of 0.1 μm is employed, with an EBSD, for a measurement range of 50 μm in a direction parallel to a surface of any substrate.

Figure 1:
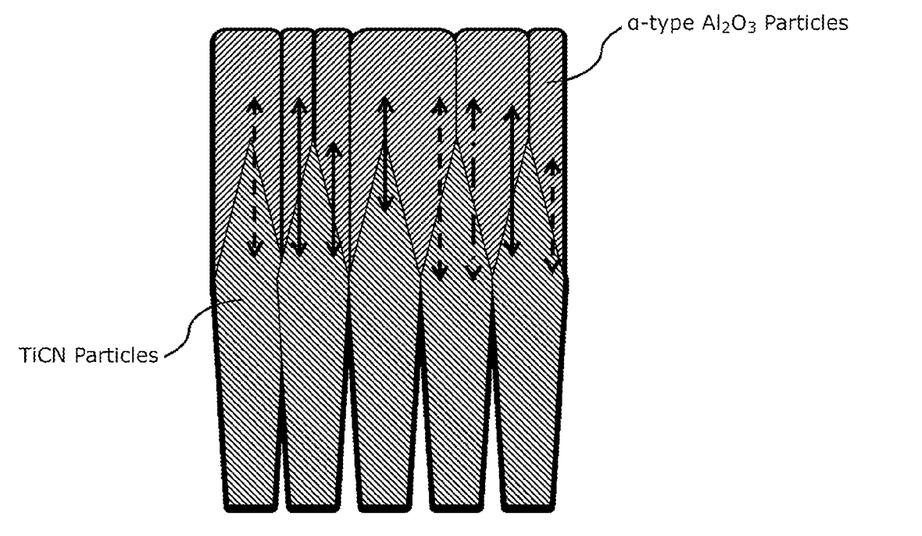
FIG. 1 is a cross-sectional view illustrating an example of equations (1) to (3).

FIG. 1 is a schematic cross-sectional view for illustrating an example of equations (1) to (3) above, and such view shows part of a region where a lower layer and an upper layer are in direct contact with each other, where TiCN particles are present on the lower layer side and α-type $Al_2O_3$ particles are present on the upper layer side. In the FIGURE, the total number of arrows (eight in FIG. 1) corresponds to RS, the total number of solid line arrows (four in FIG. 1) corresponds to R1, the total number of broken line arrows (three in FIG. 1) corresponds to R2, and the total number of long dashed short dashed line arrows (one in FIG. 1) corresponds to the total number of combinations of a TiCN particle and an α-type $Al_2O_3$ particle which satisfy neither condition (I) nor condition (II). In FIG. 1, RC in equation (1) is 87.5%, RC1 in equation (2) is 50%, and RC2 in equation (3) is 37.5%.

From the perspective of more effectively and reliably providing the effects of the present invention, the TiCN content in the lower layer is preferably 95 mass % or more based on the total content of the lower layer, is more preferably 98 mass % or more based thereon, and is further preferably 99 mass % or more based thereon, and most preferably, the lower layer consists of TiCN. Further, from the same perspective, the α-type $Al_2O_3$ content in the upper layer is preferably 95 mass % or more based on the total content of the upper layer, is more preferably 98 mass % or more based thereon, and is further preferably 99 mass % or more based thereon, and most preferably, the upper layer consists of α-type $Al_2O_3$. The lower layer and the upper layer may contain inevitable impurities and may comprise substances other than TiCN and α-type $Al_2O_3$ (for example, the Cl element and the S element), as long as the operation and effects of the present invention are not hindered.

The average thickness of the upper layer of the present embodiment is preferably from 1 μm or more to 15 μm or less. If the average thickness of the upper layer is 1 μm or more, this leads to the tendency of the crater wear resistance in the rake surface of the coated cutting tool to be further improved, and if such average thickness is 15 μm or less, this further suppresses peeling, thereby leading to the tendency of the fracture resistance to be further improved. From the same perspective, the average thickness of the upper layer is more preferably from 3 μm or more to 12 μm or less.

In the coating layer of the present embodiment, the lower layer being provided between the substrate and the upper layer leads to improved wear resistance. The average thickness of the lower layer is preferably from 2 μm or to 20 μm or less. If the average thickness of the lower layer is 2 μm or more, this indicates the tendency of the wear resistance to be improved, and, if such average thickness is 20 μm or less, this further suppresses peeling, thereby leading to the tendency of the fracture resistance to be further improved. From the same perspective, the average thickness of the lower layer is more preferably from 5 μm or more to 15 μm or less.

<Adhesion Layer>

The coating layer of the present embodiment preferably comprises an adhesion layer containing a compound of the Ti element and an element of at least one kind selected from the group consisting of C, N, O and B because this leads to further improved adhesion between the two layers which sandwich the adhesion layer. The adhesion layer may be provided, as the lowermost layer, between the substrate and the lower layer, or may be provided, as an intermediate layer, between the lower layer and the upper layer. The adhesion layer may contain, as an optional component, an element of at least one kind selected from the group consisting of Zr, Hf, V, Nb, Ta, Cr, Mo, W, Al and Si. The average thickness of the adhesion layer is preferably from 0.1 μm or more to 0.5 μm or less. If the average thickness of the adhesion layer is 0.1 μm or more, the adhesion layer has a more uniform structure, thereby leading to the tendency of the adhesion to be further improved. Meanwhile, if the average thickness of the adhesion layer is 0.5 μm or less, this further prevents the adhesion layer from serving as a starting point for peeling, thereby leading to the tendency of the fracture resistance to be further increased. Further, the compound content in the adhesion layer is preferably 95 mass % or more based on the total content of the adhesion layer, is more preferably 98 mass % or more based thereon, and is further preferably 99 mass % or more based thereon, and most preferably, the adhesion layer consists of the above compound.

The coating layer of the present embodiment preferably comprises an intermediate layer containing a compound of at least one kind selected from the group consisting of a Ti carbide, a Ti nitride, a Ti oxide, a Ti oxycarbide, a Ti oxynitride and a Ti oxycarbonitride from the perspective of further increasing the adhesion between the lower layer and the upper layer. Further, the average thickness of the intermediate layer is preferably from 0.1 μm or more to 0.5 μm or less. If the average thickness of the intermediate layer is 0.1 μm or more, the intermediate layer has a more uniform structure, thereby leading to the tendency of the adhesion to be further improved. Meanwhile, if the average thickness of the intermediate layer is 0.5 μm or less, this prevents the ratio RC from being reduced, thereby leading to the tendency of the fracture resistance to be further increased.

Examples of a method of forming layers that constitute a coating layer in a coated cutting tool according to the present invention include the method set forth below. However, such method of forming layers is not limited thereto.

For instance, a layer comprised of TiN, which may be used as an adhesion layer or an intermediate layer, can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A layer comprised of TiC, which may be used as an adhesion layer or an intermediate layer, can be formed by chemical vapor deposition with a raw material gas composition of $TiCl_4$: from 1.0 mol % or more to 3.0 mol % or less, $CH_4$: from 4.0 mol % or more to 6.0 mol % or less, and $H_2$: the balance, a temperature of from 990° C. or higher to 1,030° C. or lower, and a pressure of from 50 hPa or higher to 100 hPa or lower.

A layer comprised of TiAlCNO, which may be used as an adhesion layer, can be formed by chemical vapor deposition with a raw material gas composition of $TiCl_4$: from 3.0 mol % or more to 5.0 mol % or less, $AlCl_3$: from 1.0 mol % or more to 2.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A layer comprised of TiAlCO, which may be used as an adhesion layer, can be formed by chemical vapor deposition with a raw material gas composition of $TiCl_4$: from 0.5 mol % or more to 1.5 mol % or less, $AlCl_3$: from 3.0 mol % or more to 5.0 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

A layer comprised of TiCNO, which may be used as an adhesion layer or an intermediate layer, can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A layer comprised of TiCO, which may be used as an adhesion layer or an intermediate layer, can be formed by chemical vapor deposition with a raw material gas composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

In the present embodiment, a coated cutting tool in which the orientation relationships between the TiCN particles in the lower layer and the α-type $Al_2O_3$ particles in the upper layer have been controlled so as to satisfy conditions (I) and (II) can be obtained by, for example, the method set forth below.

Firstly, a lower first layer, serving as part of a lower layer, is formed on a surface of a substrate or an adhesion layer. The lower first layer is formed by chemical vapor deposition with a raw material gas composition of $TiCl_4$: from 10 mol % or more to 15 mol % or less, $CH_3CN$: from 1 mol % or more to 3 mol % or less, $N_2$: from 0 mol % or more to 20 mol % or less, and $H_2$: the balance, a temperature of from 850° C. or higher to 920° C. or lower, and a pressure of from 60 hPa or higher to 80 hPa or lower.

Next, a lower second layer, serving another part of the lower layer, is formed on a surface of the lower first layer. The lower second layer is formed by chemical vapor deposition with a raw material gas composition of $TiCl_4$: from 1 mol % or more to 5 mol % or less, $CH_3CN$: from 0 mol % or more to 1 mol % or less, $CH_4$: from 1 mol % or more to 4 mol % or less, $N_2$: from 0 mol % or more to 5 mol % or less, and $H_2$: the balance, a temperature of from 920° C. or higher to 970° C. or lower, and a pressure of from 100 hPa or higher to 150 hPa or lower.

Thereafter, an intermediate layer is formed, if necessary, on a surface of the lower second layer, as described above, and then, a nucleus of α-type $Al_2O_3$, serving as part of the upper layer, is formed on the surface of the lower second layer or a surface of the intermediate layer. The nucleus of α-type $Al_2O_3$ is formed by chemical vapor deposition with a raw material gas composition of $AlCl_3$: from 1.0 mol % or more to 4.0 mol % or less, $CO_2$: from 1.0 mol % or more to 3.0 mol % or less, CO: from 0 mol % or more to 2.0 mol % or less, HCl: from 2.0 mol % or more to 3.0 mol % or less, $H_2S$: from 0 mol % or more to 0.1 mol % or less, and $H_2$: the balance, a temperature of from 920° C. or higher to 950° C. or lower, and a pressure of from 60 hPa or higher to 80 hPa or lower.

Further, α-type $Al_2O_3$, serving another part of the upper layer, is formed on the surface of the lower second layer or the surface of the intermediate layer as well as a surface of the nucleus of α-type $Al_2O_3$. α-type $Al_2O_3$ is formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 950° C. or higher to 1,000° C. or lower, and a pressure of from 60 hPa or higher to 80 hPa or lower.

When, as described above, the lower first layer, the lower second laser, the arbitrary intermediate layer and the α-type $Al_2O_3$, serving as the other part of the upper layer, are formed, this allows condition (I) to be satisfied. Further, when, as described above, the lower first layer, the lower second layer, the arbitrary intermediate layer, the nucleus of α-type $Al_2O_3$, and the α-type $Al_2O_3$, serving as the other part of the upper layer, are formed, this allows both conditions (I) and (II) to be satisfied. Therefore, for example, the time for the formation of the nucleus of α-type $Al_2O_3$ is varied, whereby it is possible to control the ratios of the particles satisfying the relationship of condition (I) and the particles satisfying the relationship of condition (II). For instance, the time for the formation of the nucleus of α-type $Al_2O_3$ may be from 3 minutes or more to 15 minutes or less.

The thickness of each layer in the coating layer of the coated cutting tool of the present embodiment can be measured from a cross-sectional structure of the coated cutting tool, using an optical microscope, a scanning electron microscope (SEM), a field emission scanning electron microscope (FE-SEM) or the like. It should be noted that the average thickness of each layer in the coated cutting tool of the present embodiment can be obtained by: measuring the thickness of each layer at three or more locations near the position 50 μm from the edge, toward the center of the rake surface of the coated cutting tool; and calculating the average value of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS) or the like.

EXAMPLES

Although the present invention will be described in further detail below, with examples, the present invention is not limited to such examples.

The thickness of each layer of each of the samples was obtained as set forth below. That is, using an FE-SEM, the average thickness was obtained by: measuring the thickness of each layer at three locations in the cross-sectional surface near the position 50 μm from the edge of the coated cutting tool, toward the center of the rake surface thereof; and calculating the average value of the resulting measurements.

Information concerning the respective misorientations of the TiCN particles in the lower layer of the obtained sample and the α-type $Al_2O_3$ particles in the upper layer thereof was obtained using an EBSD attached to an FE-SEM.

A cemented carbide cutting insert with a shape of JIS standard CNMA120408 and a composition of 93.1WC-6.5Co-0.4$Cr_3C_2$ (mass %) was prepared as a substrate. The cutting edge of such substrate was subjected to round honing by means of an SiC brush, and the surface of the substrate was then washed.

After the substrate surface was washed, a coating layer was formed by chemical vapor deposition. As to invention samples 1 to 11, firstly, the substrate was inserted into an external heating chemical vapor deposition apparatus, and the lowermost layer shown in Table 2 was formed on the substrate surface so as to have the average thickness shown in Table 2 under the raw material gas composition, temperature and pressure conditions shown in Table 1. Then, a lower layer, including the lower first layer and the lower second layer shown in FIG. 4, was formed on the surface of the lowermost layer so as to have the average thickness shown in Table 2 under the raw material gas composition, temperature and pressure conditions shown in Table 1. Thereafter, as to invention samples 1 to 3 and invention samples 5 to 11, the intermediate layer shown in Table 2 was formed on the surface of the lower layer so as to have the average thickness shown in Table 2 under the raw material gas composition, temperature and pressure conditions shown in Table 1. Meanwhile, as to invention sample 4, an intermediate layer was not formed. Then, the nucleus of α-type $Al_2O_3$ (part of the upper layer) shown in Table 4 was formed on the surface of the intermediate layer (as to invention sample 4, the lower layer) under the raw material gas composition, temperature and pressure conditions shown in Table 1 for the formation time shown in Table 4. Further, the other α-type $Al_2O_3$ (another part of the upper layer) shown in Table 4 was formed on the surface of the lower layer or the surface of the intermediate layer as well as the surface of the nucleus of α-type $Al_2O_3$ such that the upper layer has the average thickness shown in Table 2 under the raw material gas composition, temperature and pressure conditions shown in Table 1. As a result, the coated cutting tools of invention samples 1 to 11 were obtained.

Meanwhile, as to comparative samples 1 to 10, firstly, the substrate was inserted into an external heating chemical vapor deposition apparatus, and the lowermost layer shown in Table 3 was formed on the substrate surface so as to have the average thickness shown in Table 3 under the raw material gas composition, temperature and pressure conditions shown in Table 1. Then, as to comparative samples 1, 2, 5 to 7 and 9, a lower layer, including the lower first layer and the lower second layer shown in Table 5, was formed on the surface of the lowermost layer so as to have the average thickness shown in Table 2 under the raw material gas composition, temperature and pressure conditions shown in Table 1. Meanwhile, as to comparative samples 3, 4, 8 and 10, the lower layer shown in Table 5 was formed on the surface of the lowermost layer so as to have the average thickness shown in Table 2 under the raw material gas composition, temperature and pressure conditions shown in Table 1. Next, the intermediate layer shown in Table 3 was formed on the surface of the lower layer so as to have the average thickness shown in Table 3 under the raw material gas composition, temperature and pressure conditions shown in Table 1. Then, as to comparative samples 1, 2 and 9, the nucleus of α-type $Al_2O_3$ (part of the upper layer) shown in Table 5 was formed on the surface of the intermediate layer under the raw material gas composition, temperature and pressure conditions shown in Table 5 for the formation time shown in Table 5. As to comparative samples 5 to 7, the α-type $Al_2O_3$ (the upper layer) shown in Table 5 was formed on the surface of the intermediate layer so as to have the average thickness shown in Table 3 under the raw material gas composition, temperature and pressure conditions shown in Table 1. Further, as to comparative samples 1 to 4 and 8 to 10, the α-type $Al_2O_3$ (part of the upper layer) shown in Table 5 was formed on the relevant surface so as to have the average thickness shown in Table 3 under the raw material gas composition, temperature and pressure conditions shown in Table 1. As a result, the coated cutting tools of comparative samples 1 to 10 were obtained.

TABLE 1

| Each layer composition | Temperature (° C.) | Pressure (hPa) | Raw material gas composition (mol %) |
|---|---|---|---|
| TiN | 900 | 400 | $TiCl_4$: 7.5%, $N_2$: 40%, $H_2$: 52.5% |
| TiC | 1,000 | 75 | $TiCl_4$: 2.4%, $CH_4$: 4.6%, $H_2$: 93% |
| TiCN-1(a) | 850 | 60 | $TiCl_4$: 10.0%, $CH_3CN$: 1.5%, $H_2$: 88.5% |

TABLE 1-continued

| Each layer composition | Temperature (° C.) | Pressure (hPa) | Raw material gas composition (mol %) |
|---|---|---|---|
| TiCN-1(b) | 880 | 60 | $TiCl_4$: 14.5%, $CH_3CN$: 1.0%, $N_2$: 10.0%, $H_2$: 74.5% |
| TiCN-1(c) | 910 | 80 | $TiCl_4$: 12.0%, $CH_3CN$: 2.5%, $N_2$: 15.0%, $H_2$: 70.5% |
| TiCN-2(a) | 930 | 150 | $TiCl_4$: 3.0%, $CH_3CN$: 0.5%, $CH_4$: 2.0%, $H_2$: 94.5% |
| TiCN-2(b) | 950 | 120 | $TiCl_4$: 5.0%, $CH_3CN$: 0.2%, $CH_4$: 3.5%, $N_2$: 5.0%, $H_2$: 86.3% |
| TiCN-2(c) | 970 | 120 | $TiCl_4$: 5.0%, $CH_3CN$: 1.0%, $CH_4$: 1.5%, $N_2$: 3.0%, $H_2$: 89.5% |
| TiCN (comparative samples) | 800 | 75 | $TiCl_4$: 3.0%, $CH_3CN$: 0.3%, $H_2$: 96.7% |
| TiCNO | 1,000 | 100 | $TiCl_4$: 3.5%, CO: 0.7%, $N_2$: 35.5%, $H_2$: 60.3% |
| TiAlCNO | 1,000 | 100 | $TiCl_4$: 3.8%, $AlCl_3$: 1.5%, CO: 0.7%, $N_2$: 35.2%, $H_2$: 58.8% |
| TiCO | 1,000 | 80 | $TiCl_4$: 1.3%, CO: 2.7%, $H_2$: 96% |
| TiAlCO | 1,000 | 80 | $TiCl_4$: 1.1%, $AlCl_3$: 3.9%, CO: 2.8%, $H_2$: 92.2% |
| α-type $Al_2O_3$ nucleus (a) | 900 | 70 | $AlCl_3$: 2.7%, $CO_2$: 1.5%, CO: 0.5%, HCl: 2.5%, $H_2$: 92.8% |
| α-type $Al_2O_3$ nucleus (b) | 920 | 70 | $AlCl_3$: 1.7%, $CO_2$: 2.5%, CO: 1.2%, HCl: 2.0%, $H_2$: 92.6% |
| α-type $Al_2O_3$ nucleus (c) | 940 | 70 | $AlCl_3$: 3.7%, $CO_2$: 2.3%, CO: 1.8%, HCl: 3.0%, $H_2S$: 0.1%, $H_2$: 89.1% |
| α-type $Al_2O_3$ (a) | 960 | 70 | $AlCl_3$: 3.0%, $CO_2$: 3.3%, HCl: 2.5%, $H_2S$: 0.15%, $H_2$: 91.05% |
| α-type $Al_2O_3$ (b) | 980 | 70 | $AlCl_3$: 4.0%, $CO_2$: 3.0%, HCl: 2.5%, $H_2S$: 0.2%, $H_2$: 90.3% |
| α-type $Al_2O_3$ (c) | 1,000 | 70 | $AlCl_3$: 5.0%, $CO_2$: 3.8%, HCl: 3.0%, $H_2S$: 0.25%, $H_2$: 87.95% |
| α-type $Al_2O_3$ (comparative samples) | 1,000 | 70 | $AlCl_3$: 2.7%, $CO_2$: 3.3%, HCl: 2.5%, $H_2S$: 0.3%, $H_2$: 91.2% |

TABLE 2

| | Coating layer | | | | | | | | |
|---|---|---|---|---|---|---|---|---|---|
| | Lowermost layer | | Lower layer | | Intermediate layer | | Upper layer | | |
| Sample No. | Composition | Average thickness (μm) | Composition | Average thickness (μm) | Composition | Average thickness (μm) | Composition | Average thickness (μm) | Total thickness (μm) |
| Invention sample 1 | TiN | 0.3 | TiCN | 7.0 | TiCNO | 0.7 | α-type $Al_2O_3$ | 5.2 | 13.2 |
| Invention sample 2 | TiN | 0.5 | TiCN | 2.0 | TiCNO | 0.5 | α-type $Al_2O_3$ | 10.5 | 13.5 |
| Invention sample 3 | TiN | 0.2 | TiCN | 14.8 | TiAlCNO | 0.2 | α-type $Al_2O_3$ | 2.0 | 17.2 |
| Invention sample 4 | TiN | 0.3 | TiCN | 20.0 | None | 0.0 | α-type $Al_2O_3$ | 5.0 | 25.3 |
| Invention sample 5 | TiN | 0.2 | TiCN | 9.8 | TiCNO | 0.3 | α-type $Al_2O_3$ | 7.4 | 17.7 |
| Invention sample 6 | TiN | 0.2 | TiCN | 7.0 | TiCO | 0.3 | α-type $Al_2O_3$ | 7.0 | 14.5 |
| Invention sample 7 | TiN | 1.0 | TiCN | 7.2 | TiAlCO | 0.3 | α-type $Al_2O_3$ | 9.8 | 18.3 |
| Invention sample 8 | TiC | 1.0 | TiCN | 10.4 | TiCNO | 0.5 | α-type $Al_2O_3$ | 10.2 | 22.1 |
| Invention sample 9 | TiC | 0.3 | TiCN | 4.5 | TiCO | 0.5 | α-type $Al_2O_3$ | 5.0 | 10.3 |
| Invention sample 10 | TiN | 0.5 | TiCN | 5.0 | TiCNO | 0.5 | α-type $Al_2O_3$ | 15.0 | 21.0 |
| Invention sample 11 | TiN | 0.2 | TiCN | 6.5 | TiCNO | 1.0 | α-type $Al_2O_3$ | 6.2 | 13.9 |

TABLE 3

| Sample No. | Coating layer | | | | | | | Total thickness (μm) |
|---|---|---|---|---|---|---|---|---|
| | Lowermost layer | | Lower layer | | Intermediate layer | | Upper layer | |
| | Composition | Average thickness (μm) | Composition | Average thickness (μm) | Composition | Average thickness (μm) | Composition | Average thickness (μm) | |
| Comparative sample 1 | TiN | 0.2 | TiCN | 5.2 | TiCNO | 0.1 | α-type Al$_2$O$_3$ | 5.4 | 10.9 |
| Comparative sample 2 | TiN | 0.3 | TiCN | 6.8 | TiCNO | 0.1 | α-type Al$_2$O$_3$ | 10.2 | 17.4 |
| Comparative sample 3 | TiC | 0.3 | TiCN | 20.0 | TiAlCNO | 0.5 | α-type Al$_2$O$_3$ | 4.4 | 25.2 |
| Comparative sample 4 | TiN | 0.2 | TiCN | 2.0 | TiCNO | 0.5 | α-type Al$_2$O$_3$ | 5.5 | 8.2 |
| Comparative sample 5 | TiN | 0.2 | TiCN | 5.8 | TiCNO | 0.7 | α-type Al$_2$O$_3$ | 7.6 | 14.3 |
| Comparative sample 6 | TiN | 0.2 | TiCN | 14.8 | TiAlCNO | 1.0 | α-type Al$_2$O$_3$ | 7.8 | 23.8 |
| Comparative sample 7 | TiC | 0.2 | TiCN | 7.2 | TiCNO | 1.3 | α-type Al$_2$O$_3$ | 15.0 | 23.7 |
| Comparative sample 8 | TiN | 0.3 | TiCN | 10.0 | TiCO | 0.3 | α-type Al$_2$O$_3$ | 10.0 | 20.6 |
| Comparative sample 9 | TiN | 1.0 | TiCN | 10.5 | TiCNO | 0.3 | α-type Al$_2$O$_3$ | 5.2 | 17.0 |
| Comparative sample 10 | TiN | 1.0 | TiCN | 5.0 | TiCNO | 0.5 | α-type Al$_2$O$_3$ | 10.2 | 16.7 |

TABLE 4

| Sample No. | Lower first layer (TiCN-1) | Lower second layer (TiCN-2) | TiCN (comparative samples) | Intermediate layer | α-type Al$_2$O$_3$ nucleus | α-type Al$_2$O$_3$ | α-type Al$_2$O$_3$ (comparative samples) | α-type Al$_2$O$_3$ formation time (min) |
|---|---|---|---|---|---|---|---|---|
| Invention sample 1 | TiCN-1 (a) | TiCN-2 (a) | Absent | Existing | α-type Al$_2$O$_3$ nucleus (c) | α-type Al$_2$O$_3$ (a) | Absent | 6 |
| Invention sample 2 | TiCN-1 (a) | TiCN-2 (b) | Absent | Existing | α-type Al$_2$O$_3$ nucleus (c) | α-type Al$_2$O$_3$ (b) | Absent | 3 |
| Invention sample 3 | TiCN-1 (a) | TiCN-2 (b) | Absent | Existing | α-type Al$_2$O$_3$ nucleus (a) | α-type Al$_2$O$_3$ (c) | Absent | 6 |
| Invention sample 4 | TiCN-1 (a) | TiCN-2 (c) | Absent | Absent | α-type Al$_2$O$_3$ nucleus (a) | α-type Al$_2$O$_3$ (a) | Absent | 12 |
| Invention sample 5 | TiCN-1 (b) | TiCN-2 (a) | Absent | Existing | α-type Al$_2$O$_3$ nucleus (a) | α-type Al$_2$O$_3$ (b) | Absent | 15 |
| Invention sample 6 | TiCN-1 (b) | TiCN-2 (b) | Absent | Existing | α-type Al$_2$O$_3$ nucleus (a) | α-type Al$_2$O$_3$ (c) | Absent | 9 |
| Invention sample 7 | TiCN-1 (b) | TiCN-2 (b) | Absent | Existing | α-type Al$_2$O$_3$ nucleus (b) | α-type Al$_2$O$_3$ (a) | Absent | 12 |
| Invention sample 8 | TiCN-1 (b) | TiCN-2 (c) | Absent | Existing | α-type Al$_2$O$_3$ nucleus (b) | α-type Al$_2$O$_3$ (b) | Absent | 6 |
| Invention sample 9 | TiCN-1 (c) | TiCN-2 (a) | Absent | Existing | α-type Al$_2$O$_3$ nucleus (b) | α-type Al$_2$O$_3$ (c) | Absent | 9 |
| Invention sample 10 | TiCN-1 (c) | TiCN-2 (b) | Absent | Existing | α-type Al$_2$O$_3$ nucleus (b) | α-type Al$_2$O$_3$ (a) | Absent | 9 |
| Invention sample 11 | TiCN-1 (c) | TiCN-2 (c) | Absent | Existing | α-type Al$_2$O$_3$ nucleus (c) | α-type Al$_2$O$_3$ (c) | Absent | 6 |

TABLE 5

| Sample No. | Lower first layer (TiCN-1) | Lower second layer (TiCN-2) | TiCN (comparative samples) | Intermediate layer | α-type Al$_2$O$_3$ nucleus | α-type Al$_2$O$_3$ | α-type Al$_2$O$_3$ (comparative samples) | α-type Al$_2$O$_3$ formation time (min) |
|---|---|---|---|---|---|---|---|---|
| Comparative sample 1 | TiCN-1 (a) | TiCN-2 (a) | Absent | Existing | α-type Al$_2$O$_3$ nucleus (b) | Absent | Existing | 6 |
| Comparative sample 2 | TiCN-1 (a) | TiCN-2 (b) | Absent | Existing | α-type Al$_2$O$_3$ nucleus (c) | Absent | Existing | 6 |
| Comparative sample 3 | Absent | Absent | Existing | Existing | Absent | Absent | Existing | 0 |
| Comparative sample 4 | Absent | Absent | Existing | Existing | Absent | Absent | Existing | 0 |
| Comparative sample 5 | TiCN-1 (b) | TiCN-2 (c) | Absent | Existing | Absent | α-type Al$_2$O$_3$ (a) | Absent | 0 |
| Comparative sample 6 | TiCN-1 (b) | TiCN-2 (a) | Absent | Existing | Absent | α-type Al$_2$O$_3$ (b) | Absent | 0 |

TABLE 5-continued

| Sample No. | Lower first layer (TiCN-1) | Lower second layer (TiCN-2) | TiCN (comparative samples) | Intermediate layer | α-type Al$_2$O$_3$ nucleus | α-type Al$_2$O$_3$ | α-type Al$_2$O$_3$ (comparative samples) | α-type Al$_2$O$_3$ formation time (min) |
|---|---|---|---|---|---|---|---|---|
| Comparative sample 7 | TiCN-1 (c) | TiCN-2 (b) | Absent | Existing | Absent | | α-type Al$_2$O$_3$ (c) Absent | 0 |
| Comparative sample 8 | Absent | Absent | Existing | Existing | Absent | Absent | Existing | 0 |
| Comparative sample 9 | TiCN-1 (c) | TiCN-2 (c) | Absent | Existing | α-type Al$_2$O$_3$ nucleus (a) | Absent | Existing | 3 |
| Comparative sample 10 | Absent | Absent | Existing | Existing | Absent | Absent | Existing | 0 |

Each of the obtained coated cutting tools was mirror-polished in a direction vertical to the lamination direction of the layers such that a cross-sectional structure thereof was made exposed. The cross-sectional structure surface of the lower layer and the upper layer was observed with an FE-SEM, and, using an EBSD attached to the FE-SEM, matters (a), (b), (c), (d), (e), (f) and (g) set forth below were obtained from the information on the TiCN particles and the α-type Al$_2$O$_3$ particles for each misorientation. The results are shown in Table 6.

(a) Whether or not one or more TiCN particles and one or more α-type A$_2$O$_3$ particles are contained which satisfy the condition that at least one of {422} planes of TiCN particles located closest to the surface side of the coating layer in the lower layer and at least one of {006} planes of α-type A$_2$O$_3$ particles located closest to the substrate in the upper layer and immediately above the TiCN particles are substantially parallel to each other.

(b) Whether or not one or more TiCN particles and one or more α-type A$_2$O$_3$ particles are contained which satisfy the condition that at least one of {111} planes of TiCN particles located closest to the surface side of the coating layer in the lower layer and at least one of {110} planes of α-type A$_2$O$_3$ particles located closest to the substrate in the upper layer and immediately above the TiCN particles are substantially parallel to each other.

(c) Whether or not one or more TiCN particles and one or more α-type A$_2$O$_3$ particles are contained which satisfy the condition that at least one of {111} planes of TiCN particles located closest to the surface side of the coating layer in the lower layer and at least one of {006} planes of α-type A$_2$O$_3$ particles located closest to the substrate in the upper layer and immediately above the TiCN particles are substantially parallel to each other.

(d) Whether or not one or more TiCN particles and one or more α-type A$_2$O$_3$ particles are contained which satisfy the condition that at least one of {422} planes of TiCN particles located closest to the surface side of the coating layer in the lower layer and at least one of {110} planes of α-type A$_2$O$_3$ particles located closest to the substrate in the upper layer and immediately above the TiCN particles are substantially parallel to each other.

(e) A ratio RC1(%), being expressed by equation (2) above, of the number of combinations of a TiCN particle and an α-type Al$_2$O$_3$ particle.

(f) A ratio RC2(%), being expressed by equation (3) above, of the number of combinations of a TiCN particle and an α-type Al$_2$O$_3$ particle.

(g) A ratio RC (a sum of (e) and (f)) (%), being expressed by equation (1) above, of the number of combinations of a TiCN particle and an α-type Al$_2$O$_3$ particle.

A sample in which the cross-sectional surface of the lower layer and the upper layer has been made exposed was set on an FE-SEM. The sample was irradiated, at the cross-sectional surface, with an electron beam at an angle of incidence of 70 degrees, and at an acceleration voltage of 15 kV and an irradiation current of 0.5 nA. For any measurement range of 30 μm×50 μm, the measurement was conducted under the EBSD setting of a step size of 0.1 μm. A region surrounded by a structure boundary with a misorientation of 5 degrees or more was defined as referring to a "particle," and determinations were made regarding TiCN particles and α-type Al$_2$O$_3$ particles. The number of measurement points was 105.

TABLE 6

| Sample No. | (a) | (b) | (c) | (d) | (e) | (f) | (g) |
|---|---|---|---|---|---|---|---|
| Invention sample 1 | Yes | Yes | Yes | Yes | 42 | 15 | 57 |
| Invention sample 2 | Yes | Yes | Yes | Yes | 60 | 5 | 65 |
| Invention sample 3 | Yes | Yes | Yes | Yes | 52 | 23 | 75 |
| Invention sample 4 | Yes | Yes | Yes | Yes | 8 | 75 | 83 |
| Invention sample 5 | Yes | Yes | Yes | Yes | 5 | 87 | 92 |
| Invention sample 6 | Yes | Yes | Yes | Yes | 18 | 45 | 63 |
| Invention sample 7 | Yes | Yes | Yes | Yes | 7 | 68 | 75 |
| Invention sample 8 | Yes | Yes | Yes | Yes | 37 | 27 | 63 |
| Invention sample 9 | Yes | Yes | Yes | Yes | 27 | 45 | 72 |
| Invention sample 10 | Yes | Yes | Yes | Yes | 13 | 48 | 62 |
| Invention sample 11 | Yes | Yes | Yes | Yes | 24 | 22 | 62 |
| Comparative sample 1 | No | No | Yes | Yes | 0 | 37 | 37 |
| Comparative sample 2 | No | No | Yes | Yes | 0 | 30 | 30 |
| Comparative sample 3 | No | No | No | No | 0 | 0 | 0 |
| Comparative sample 4 | No | No | No | No | 0 | 0 | 0 |
| Comparative sample 5 | Yes | Yes | No | No | 42 | 0 | 42 |
| Comparative sample 6 | Yes | Yes | No | No | 25 | 0 | 25 |
| Comparative sample 7 | Yes | Yes | No | No | 8 | 0 | 8 |
| Comparative sample 8 | No | No | No | No | 0 | 0 | 0 |
| Comparative sample 9 | No | No | Yes | Yes | 0 | 18 | 18 |

TABLE 6-continued

| Sample No. | (a) | (b) | (c) | (d) | (e) | (f) | (g) |
|---|---|---|---|---|---|---|---|
| Comparative sample 10 | No | No | No | No | 0 | 0 | 0 |

Cutting tests 1 and 2 were conducted using the obtained samples. Cutting test 1 is a test for evaluating wear resistance, and cutting test 2 is a test for evaluating fracture resistance. The results of the respective cutting tests are shown in Table 7.

[Cutting test 1: Wear resistance test]
Workpiece material: S45C round bar
Cutting speed: 300 m/min
Feed: 0.30 mm/rev
Depth of cut: 2.0 mm
Coolant: Used
Evaluation items: A time when a sample was fractured, or a when a sample had a maximum flank wear width of 0.2 mm, was defined as the end of the tool life, and the machining time to reach the end of the tool life was measured. With regard to the damage form at this time, evaluations were made with "fracturing" for fracture and a maximum flank wear width of 0.2 mm for "normal wear."

[Cutting test 2: Fracture resistance test]
Workpiece material: SCM415 round bar with two equidistant grooves extending in the length direction
Cutting speed: 250 m/min
Feed: 0.40 mm/rev
Depth of cut: 1.5 mm
Coolant: Used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the number of contacts reached 20,000 at a maximum. As to each sample, five inserts were prepared and the number of shocks was measured for each of such inserts, and the average value was obtained from the measurements of the number of shocks so as to serve as the tool life.

TABLE 7

| Sample No. | Cutting test 1 Wear resistance test | | Cutting test 2 Fracture resistance test |
|---|---|---|---|
| | Tool life (min) | Damage form | Tool life (shocks) |
| Invention sample 1 | 33 | Normal wear | 16,000 |
| Invention sample 2 | 31 | Normal wear | 18,600 |
| Invention sample 3 | 35 | Normal wear | 20,000 |
| Invention sample 4 | 39 | Normal wear | 18,200 |
| Invention sample 5 | 41 | Normal wear | 20,000 |
| Invention sample 6 | 35 | Normal wear | 18,600 |
| Invention sample 7 | 40 | Normal wear | 20,000 |
| Invention sample 8 | 38 | Normal wear | 18,000 |
| Invention sample 9 | 32 | Normal wear | 19,200 |
| Invention sample 10 | 36 | Normal wear | 16,400 |
| Invention sample 11 | 31 | Normal wear | 15,000 |
| Comparative sample 1 | 31 | Normal wear | 13,500 |
| Comparative sample 2 | 34 | Normal wear | 12,600 |
| Comparative sample 3 | 26 | Fracturing | 8,700 |
| Comparative sample 4 | 15 | Fracturing | 7,200 |
| Comparative sample 5 | 30 | Normal wear | 14,200 |
| Comparative sample 6 | 29 | Normal wear | 12,400 |
| Comparative sample 7 | 33 | Normal wear | 6,500 |
| Comparative sample 8 | 27 | Fracturing | 9,700 |
| Comparative sample 9 | 24 | Normal wear | 12,900 |
| Comparative sample 10 | 20 | Fracturing | 9,800 |

Table 7 indicates that the invention samples each involved improved wear resistance without reductions in the chipping resistance and fracture resistance thereof. It is apparent that each invention sample has a longer machining time to reach the end of the tool life than that of each comparative sample and also involves a larger number of shocks than that of each comparative sample, whereby each invention sample has a significantly extended tool life.

The present application is based on the Japanese patent application filed on Jul. 1, 2016 (JP Appl. 2016-131717), the content of which is incorporated herein by reference.

INDUSTRIAL APPLICABILITY

The coated cutting tool according to the present invention has excellent wear resistance without reductions in the chipping resistance and fracture resistance thereof, so that the tool life can be extended more than that involved in the prior art, and therefore, such coated cutting tool has industrial applicability as a coated cutting for which the above characteristics are sought.

What is claimed is:

1. A coated cutting tool comprising a substrate and a coating layer formed on the substrate, wherein:
   the coating layer comprises a lower layer containing TiCN and an upper layer containing α-type $Al_2O_3$, the lower layer and the upper layer being laminated in order from the substrate side toward a surface side of the coating layer; and
   the lower layer and the upper layer comprise a TiCN particle and an α-type $Al_2O_3$ particle which satisfy condition (I) below and a TiCN particle and an α-type $Al_2O_3$ particle which satisfy condition (II) below;
   Condition (I): At least one of {422} planes of TiCN particles located closest to the surface in the lower layer and at least one of {006} planes of α-type $Al_2O_3$ particles located closest to the substrate in the upper layer and immediately above the TiCN particles are substantially parallel to each other, and at least one of {111} planes of the TiCN particles and at least one of {110} planes of the α-type Al₂O₃ particles are substantially parallel to each other;

Condition (II): At least one of {111} planes of TiCN particles located closest to the surface in the lower layer and at least one of {006} planes of α-type Al₂O₃ particles located closest to the substrate in the upper layer and immediately above the TiCN particles are substantially parallel to each other, and at least one of {422} planes of the TiCN particles and at least one of {110} planes of the α-type Al₂O₃ particles are substantially parallel to each other.

2. The coated cutting tool according to claim 1, wherein, based on a total number of TiCN particles located closest to the surface in the lower layer and α-type Al₂O₃ particles located closest to the substrate in the upper layer, a ratio of a total number of TiCN particles and α-type Al₂O₃ particles which satisfy condition (I) and TiCN particles and α-type Al₂O₃ particles which satisfy condition (II) is from 50% or more to 100% or less.

3. The coated cutting tool according to claim 1, wherein an average thickness of the upper layer is from 1 μm or more to 15 μm or less.

4. The coated cutting tool according to claim 1, wherein an average thickness of the lower layer is from 2 μm or more to 20 μm or less.

5. The coated cutting tool according to claim 1, wherein the coating layer comprises, between the lower layer and the upper layer, an intermediate layer containing a compound of at least one kind selected from the group consisting of a Ti carbide, a Ti nitride, a Ti oxide, a Ti oxycarbide, a Ti oxynitride and a Ti oxycarbonitride, and an average thickness of the intermediate layer is from 0.1 μm or more to 0.5 μm or less.

6. The coated cutting tool according to claim 1, wherein an average thickness of the coating layer is from 3 μm or more to 30 μm or less.

7. The coated cutting tool according to claim 1, wherein the substrate is a cemented carbide, cermet, ceramic or a cubic boron nitride sintered body.

8. The coated cutting tool according to claim 2, wherein an average thickness of the upper layer is from 1 μm or more to 15 μm or less.

9. The coated cutting tool according to claim 3, wherein an average thickness of the lower layer is from 2 μm or more to 20 μm or less.

10. The coated cutting tool according to claim 2, wherein the coating layer comprises, between the lower layer and the upper layer, an intermediate layer containing a compound of at least one kind selected from the group consisting of a Ti carbide, a Ti nitride, a Ti oxide, a Ti oxycarbide, a Ti oxynitride and a Ti oxycarbonitride, and an average thickness of the intermediate layer is from 0.1 μm or more to 0.5 μm or less.

11. The coated cutting tool according to claim 3, wherein the coating layer comprises, between the lower layer and the upper layer, an intermediate layer containing a compound of at least one kind selected from the group consisting of a Ti carbide, a Ti nitride, a Ti oxide, a Ti oxycarbide, a Ti oxynitride and a Ti oxcarbonitride, and an average thickness of the intermediate layer is from 0.1 μm or more to 0.5 μm or less.

12. The coated cutting tool according to claim 4, wherein the coating layer comprises, between the lower layer and the upper layer, an intermediate layer containing a compound of at least one kind selected from the group consisting of a Ti carbide, a Ti nitride, a Ti oxide, a Ti oxycarbide, a Ti oxynitride and a Ti oxycarbonitride, and an average thickness of the intermediate layer is from 0.1 μm or more to 0.5 μm or less.

13. The coated cutting tool according to claim 2, wherein an average thickness of the coating layer is from 3 μm or more to 30 μm or less.

14. The coated cutting tool according to claim 3, wherein an average thickness of the coating layer is from 3 μm or more to 30 μm or less.

15. The coated cutting tool according to claim 4, wherein an average thickness of the coating layer is from 3 μm or more to 30 μm or less.

16. The coated cutting tool according to claim 5, wherein an average thickness of the coating layer is from 3 μm or more to 30 μm or less.

17. The coated cutting tool according to claim 1, wherein the substrate is a cemented carbide, cermet, ceramic or a cubic boron nitride sintered body.

18. The coated cutting tool according to claim 2, wherein the substrate is a cemented carbide, cermet, ceramic or a cubic boron nitride sintered body.

19. The coated cutting tool according to claim 3, wherein the substrate is a cemented carbide, cermet, ceramic or a cubic boron nitride sintered body.

20. The coated cutting tool according to claim 4, wherein the substrate is a cemented carbide, cermet, ceramic or a cubic boron nitride sintered body.

* * * * *